(12) United States Patent
Theil (10) Patent No.: US 6,373,117 B1
(45) Date of Patent: Apr. 16, 2002

(54) STACKED MULTIPLE PHOTOSENSOR STRUCTURE INCLUDING INDEPENDENT ELECTRICAL CONNECTIONS TO EACH PHOTOSENSOR

(75) Inventor: Jeremy A Theil, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/304,433

(22) Filed: May 3, 1999

(51) Int. Cl.$^7$ ............................................. H01L 31/00
(52) U.S. Cl. ..................... 257/444; 257/72; 257/448; 257/449
(58) Field of Search .......................... 257/21, 72, 82, 257/84, 8, 113, 436, 443–444, 446–447, 448–449, 457, 459–460

(56) References Cited

U.S. PATENT DOCUMENTS 5,838,054 A * 11/1998 Kwasnick et al. .......... 257/457
6,114,739 A * 9/2000 Theil et al. ................. 257/458

FOREIGN PATENT DOCUMENTS

EP        0 428 050 A1 * 7/1990

* cited by examiner

Primary Examiner—Nathan Flynn
Assistant Examiner—Ahmed N. Sefer (57) ABSTRACT

A multiple-photosensor structure. The multiple-photosensor structure includes a substrate. A first photosensor is formed adjacent to the substrate. A first pixel electrode of the first photosensor is electrically connected to the substrate. A first transparent conductive layer is formed adjacent to the first photosensor. The first transparent conductive layer electrically connects a first outer electrode of the first photosensor to the substrate. A second photosensor is adjacent to the first transparent conductive layer. A second pixel electrode of the second photosensor is electrically connected to the substrate through the first transparent conductive layer. A second transparent conductive layer is adjacent to the second photosensor. The second transparent conductive layer electrically connects a second outer electrode of the second photosensor to the substrate. The multiple-photosensor structure can further include a third photosensor formed adjacent to the second transparent conductive layer. A third pixel electrode of the third photosensor is electrically connected to the substrate through the second transparent conductive layer. A third transparent conductive layer is formed adjacent to the third photosensor. The third transparent conductive layer electrically connects a third outer electrode of the third photosensor to the substrate.

23 Claims, 8 Drawing Sheets

STACKED MULTIPLE PHOTOSENSOR STRUCTURE INCLUDING INDEPENDENT ELECTRICAL CONNECTIONS TO EACH PHOTOSENSOR

FIELD OF INVENTION

This invention relates generally to active pixel photosensors. In particular, it relates to a stacked multiple active pixel photo sensor that includes independent electrical connections to each photosensor, allowing multiple color detection.

BACKGROUND

An array of photo pixel sensors detect the intensity of light received by the photo pixel sensors. The photo pixel sensors typically generate electronic signals that have amplitudes that are proportionate to the intensity of the light received by the photo pixel sensors. The photo pixel sensors can convert an optical image into a set of electronic signals. The electronic signals may represent intensities of colors of light received by the photo pixel sensors. The electronic signals can be conditioned and sampled to allow image processing.

Integration of the photo pixel sensors with signal processing circuitry is becoming more important because integration enables miniaturization and simplification of imaging systems. Integration of photo pixel sensors along with analog and digital signal processing circuitry allows electronic imaging systems to be low cost, compact and require low power.

Historically, photo pixel sensors have predominantly been charged coupled devices (CCDs). CCDs are relatively small and can provide a high-fill factor. However, CCDs are very difficult to integrate with digital and analog circuitry. Further, CCDs dissipate large amounts of power and suffer from image smearing problems.

An alternative to CCD sensors are active pixel sensors. Active pixel sensors can be fabricated using standard CMOS processes. Therefore, active pixel sensors can easily be integrated with digital and analog signal processing circuitry. Further, CMOS circuits dissipate small amounts of power.

Figure 1:
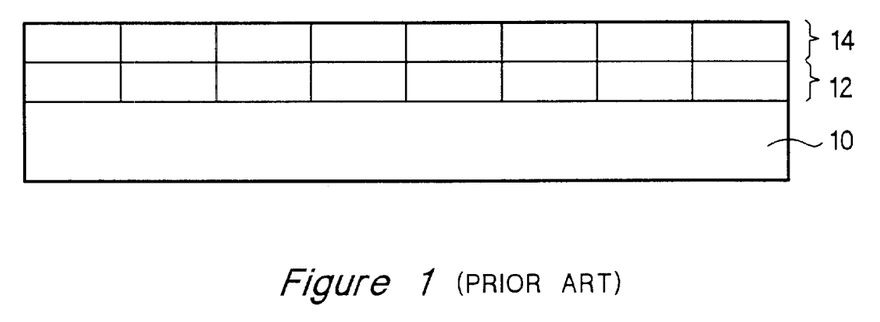
FIG. 1 shows a cross-section of a prior art array of photosensors.

FIG. 1 shows a prior art array of active pixel sensors. An array of sensors 12 are formed over a substrate 10. An array of color filters 14 is formed over the array of sensors 12. Light passes through the color filters 14 and is received by the array of sensors 12. The sensors 12 typically conduct charge at a rate that is proportional to the intensity of the light received by the sensors 12. Circuitry located on the substrate 10 provides determination of the amount of charge conducted by the sensors 12. Therefore, the sensors 12 provide detection of the intensity of the received light.

The array of color filters 14 includes filters which pass different wavelengths of light. For example, the array of color filters 14 can include blue light, green light and red light filters. The blue light filters only passes blue light, the green light filters only passes green light and the red light filters only pass red light. Generally, each sensor of the array of sensors 12 corresponds with a single color filter of the array of color filters 14. Color detection can be obtained by knowing which sensor corresponds with which type of color filter.

The active pixel sensor array of FIG. 1 is inefficient because up to 70% of the photons within the received light are lost during the filtering process. That is, the color filters 14 attenuate the intensity of the light received by the array of sensors 12. Removing the color filters 14 increases the intensity of light received by the array of sensors 12. As a result, the color filters 14 reduce the signal to noise ratio of the electronic signals generated by the array of sensors 12.

The active pixel sensor array of FIG. 1 requires demosaicing. Each sensor of the array of sensors 12 detects the intensity of a particular color of light. Each sensor is physically displaced from all of the other sensors of the array of sensors 12. Therefore, special image processing (demosaicing) is required for determination of a representation of the color intensity received by the array of sensors 12 at each particular pixel location.

It is desirable to have an array of active pixel sensors which provide efficient absorption of photons within light received by the array of active pixel sensors, and be able to detect the color of received light. It is also desirable that the array of active pixel sensors be manufacturable without an array of color filters and not require demosaicing.

SUMMARY OF THE INVENTION

The present invention is a color detection active pixel sensor which provides efficient absorption of photons of light received by the color active detection pixel sensor while providing detection of the color of the received light. The color detection is accomplished without color filters and does not require demosaicing.

A first embodiment of the invention includes a multiple-photosensor structure. The multiple-photosensor structure includes a substrate. A first photosensor is formed adjacent to the substrate. A first pixel electrode of the first photosensor is electrically connected to the substrate. A first transparent conductive layer is formed adjacent to the first photosensor. The first transparent conductive layer electrically connects a first outer electrode of the first photosensor to the substrate. A second photosensor is adjacent to the first transparent conductive layer. A second pixel electrode of the second photosensor is electrically connected to the substrate through the first transparent conductive layer. A second transparent conductive layer is adjacent to the second photosensor. The second transparent conductive layer electrically connects a second outer electrode of the second photosensor to the substrate.

A second embodiment of the invention is similar to the first embodiment. The second embodiment includes a third photosensor formed adjacent to the second transparent conductive layer. A third pixel electrode of the third photosensor is electrically connected to the substrate through the second transparent conductive layer. A third transparent conductive layer is formed adjacent to the third photosensor. The third transparent conductive layer electrically connects a third outer electrode of the third photosensor to the substrate.

A third embodiment of the invention is similar to the first embodiment. The third embodiment includes the first photosensor detecting a first range of wavelengths of light.

A fourth embodiment of the invention is similar to the first embodiment. The fourth embodiment includes the second photosensor detecting a second range of wavelengths of light.

A fifth embodiment of the invention is similar to the second embodiment. The fifth embodiment includes the third photosensor detecting a third range of wavelengths of light.

Other aspects and advantages of the present invention will become apparent from the following detailed description, taken in conjunction with the accompanying drawings, illustrating by way of example the principles of the invention.

DETAILED DESCRIPTION

As shown in the drawings for purposes of illustration, the invention is embodied in a color detection active pixel sensor which provides efficient absorption of photons of light received by the color active detection pixel sensor while providing detection of the color of the received light. The color detection is accomplished without color filters and does not require demosaicing.

Figure 2:
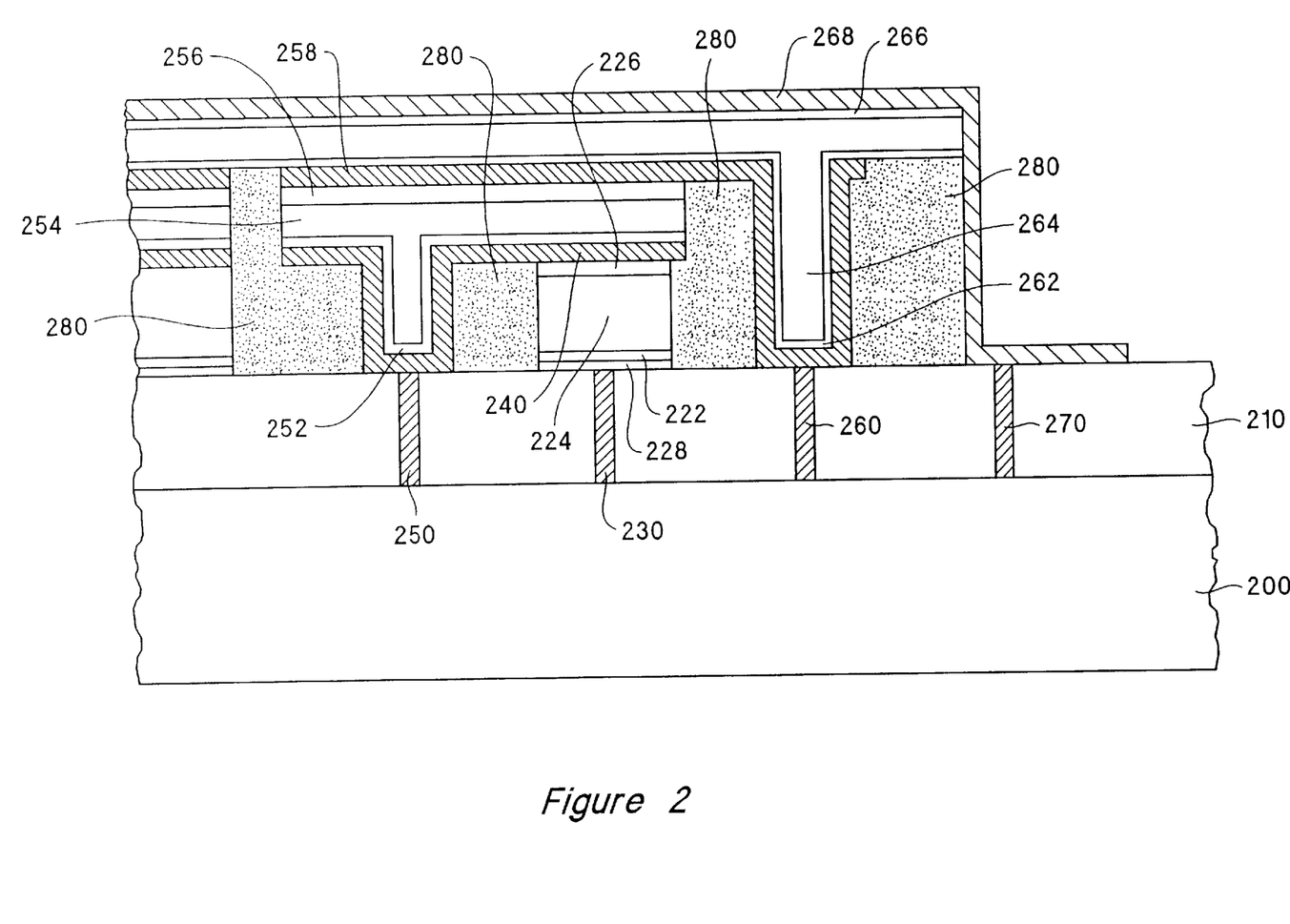
FIG. 2 shows an embodiment of the invention.

FIG. 2 shows an embodiment of the invention. The embodiment includes a substrate 200. An interconnection layer 210 is formed adjacent to the substrate 200. A first photosensor including a first pixel electrode 222, a first I-layer 224 and an outer layer 226 is formed adjacent to the interconnection layer 210. The interconnection layer 210 includes a first conductive interconnect 230 which electrically connects the first pixel electrode 222 of the first photosensor to the substrate 200. A first transparent conductor 240 electrically connects a first outer pixel electrode of the first photosensor to the substrate 200 through a second conductive interconnect 250. The first pixel electrode 222 typically includes an inner metal section 228.

The embodiment further includes a second photosensor. The second photosensor includes a second pixel electrode 252, a second I-layer 254 and a second outer layer 256. The second photosensor is formed adjacent to the first transparent conductor 240. The first transparent conductor 240 electrically connects the second pixel electrode 252 of the second photosensor to the substrate 200. A second transparent conductor 258 electrically connects a second outer pixel electrode of the second photosensor to the substrate 200 through a third conductive interconnect 260.

The embodiment can also include a third photosensor. The third photosensor includes a third pixel electrode 262, a third I-layer 264 and a third outer layer 266. The third photosensor is formed adjacent to the second transparent conductor 258. The second transparent conductor 258 electrically connects the third pixel electrode 262 of the third photosensor to the substrate 200. A third transparent conductor 268 electrically connects a third outer electrode of the third photosensor to the substrate 200 through a fourth conductive interconnect 270.

Insulating regions 280 are generally included between each of the photosensors. The insulating regions provide isolation between the first photosensor, the second photosensor and the third photosensor.

The photosensors conduct charge when the photosensors receive light. The substrate 200 generally includes sense circuitry and signal processing circuitry. The sense circuitry senses how much charge the image sensors have conducted. The amount of charge conducted represents the intensity of light received by the image sensors. Generally, the substrate 200 can be CMOS (complementary metal oxide silicon), BiCMOS or Bipolar. The substrate 200 can include various types of substrate technology including charged coupled devices.

Typically, the interconnection layer 210 is a standard interconnection structure. The structure and methods of forming this interconnection layer 210 are well known in the field of electronic integrated circuit fabrication. The interconnection layer 210 can be a subtractive metal structure, or a single or dual damascene structure.

The conductive interconnects 230, 240, 250 pass through the interconnection layer 210 and electrically connect the pixel electrodes 222, 252, 262 to the substrate 200. The fourth conductive interconnect 270 provides a reliable electrical connection between the third transparent conductor 268 and the substrate 200. Typically, the conductive interconnects 230, 240, 250, 270 are formed from tungsten. Tungsten is generally used during fabrication because tungsten can fill high aspect ratio holes. That is, tungsten can be used to form narrow and relatively long interconnections. Typically, the conductive interconnects 230, 240, 250, 270 are formed using a chemical vapor deposition (CVD) process. Other materials which can be used to form the conductive interconnects 230, 240, 250, 270 include copper, aluminum or any other electrically conductive material.

The inner metal section 228 should include a thin conductive material. The inner metal section 228 may be formed, for example, from a degenerately doped semiconductor layer, aluminum, titanium, titanium nitride, copper or tungsten. The inner metal section 228 should be thin (approximately 500 Angstroms) and smooth. The inner metal section 228 should be smooth enough that any surface roughness is substantially less than the thickness of the first pixel electrode 222 formed over the inner metal section 228. To satisfy the smoothness requirement, polishing of the inner metal section 228 may be required.

The inner metal section 228 can be optional. However, the inner metal section 228 has a lower resistance than the materials used to form the first pixel electrode 222. Therefore, the inner metal section 228 provides better current collection.

The pixel electrodes 222, 252, 262 are generally formed from a doped semiconductor. The doped semiconductor can be an N-layer of amorphous silicon. The pixel electrodes 222, 252, 262 must be thick enough, and doped heavily enough that the pixel electrodes 222, 252, 262 do not fully deplete when biased during operation. The pixel electrodes 222, 252, 262 are typically doped with phosphorous.

The pixel electrodes 222, 252, 262 are typically deposited using plasma etched chemical vapor deposition (PECVD). A silicon containing gas (such as $Si_2H_6$ or $SiH_4$) is included when forming amorphous silicon pixel electrodes. When forming N-layer pixel electrodes, the PECVD process is performed with a phosphorous containing gas (such as $PH_3$).

An N-layer of amorphous silicon is typically used when forming PIN image photosensors. However, the image photosensors can include an NIP sensor configuration. In this case, the pixel electrodes 222, 252, 262 are formed from a P-layer, and the outer layer sections 226, 256, 266 of FIG. 2 are replaced with N-layer sections. Alternatively, the first photosensor, the second photosensor and the third photosensor can each include different sensor configurations. For example, the first photosensor could be a PIN image photosensor and the second photosensor could be an NIP photosensor.

The I-layer sections 224, 254, 264 are generally formed from hydrogenated amorphous silicon. The I-layer sections 224, 254, 264 can be deposited using a PECVD process or a reactive sputtering process. The PECVD process must include a silicon containing gas. The deposition should be at a low enough temperature that hydrogen is retained within the film. The I-layer sections 224, 254, 264 typically on the order of one micron thick.

The outer layer sections 226, 256, 266 are generally P-layers formed from amorphous silicon. Typically, the outer layer sections 226, 256, 266 are doped with Boron.

The outer layer sections 226, 256, 266 can deposited using a PECVD process. The PECVD process is performed with a Boron containing gas. The Boron containing gas can be $B_2H_6$. A silicon containing gas is included when forming amorphous silicon P-layer outer layer sections 226, 256, 266. The thickness of the outer layer sections 226, 256, 266 must generally be controlled to ensure that the outer layer sections 226, 256, 266 do not absorb too much short wavelength (blue) light. The outer layer sections 226, 256, 266 can be made from microcrystalline silicon to provide the photosensors with better light collection.

Another embodiment of the invention does not include outer layer sections 226, 256, 266. The outer layer sections 226, 256, 266 can be eliminated with proper selection of the composition of the material within the transparent conductors 240, 258, 268, and proper selection of the doping levels of the pixel electrodes 222, 252, 262. For this embodiment, the transparent conductors 240, 258, 268 provide a conductive connection between a top surface of the I-layer sections 224, 254, 264 of the image sensors and the interconnection layer 210.

Another embodiment of the invention does not include pixel electrodes 222, 252, 262. The pixel electrodes 222, 252, 262 can be eliminated with proper selection of the doping levels of the outer layer sections 226, 256, 266. For this embodiment, the transparent conductors 240, 258, 268 provide a conductive connection between a top surface of the outer layer sections 226, 256, 266 of the image sensors and the interconnection layer 210.

The insulating regions 280 provide isolation between the stacked image sensors formed by the pixel electrodes 222, 252, 262, the I-layer sections 224, 254, 264 and the outer layer sections 226, 256, 266. That is, the insulating regions 280 provide isolation between the stacked image sensors. The insulating regions 280 are typically formed from $SiO_2$, $Si_3N_4$ or a combination of $SiO_2$ and $Si_3N_4$.

As previously described, the pixel electrodes 222, 252, 262, the I-layer sections 224, 254, 264 and the outer layer sections 226, 256, 266 are generally formed from amorphous silicon. However, the pixel electrodes 222, 252, 262, the I-layer sections 224, 254, 264 and the outer layer sections 226, 256, 266 can also be formed from amorphous carbon, amorphous silicon carbide, amorphous germanium, or amorphous silicon-germanium. It should be understood that this list is not exhaustive.

The transparent conductors 240, 258, 268 provide conductive connections between the outer layer sections 226, 256, 266 and the interconnection layer 210. Light must pass through the transparent conductors 240, 258, 268 which is received by the image sensors. Generally, the transparent conductors 240, 258, 268 are formed from an indium tin oxide. However, the transparent conductors 240, 258, 268 can also be formed from titanium nitride, thin suicide, or certain types of transition metal nitrides or oxides.

Both the selection of the type of material to be used within the transparent conductors 240, 258, 268, and the determination of the desired thickness of the transparent conductors 240, 258, 268, are based upon minimizing the optical reflection of light received by the image sensor. Minimization of the reflection of light received by the image sensor helps to optimize the amount of light detected by the image sensor.

The transparent conductors 240, 258, 268 can be deposited by a sputtering process. Deposition through sputtering is well known in the art of integrated circuit fabrication.

Figure 3:
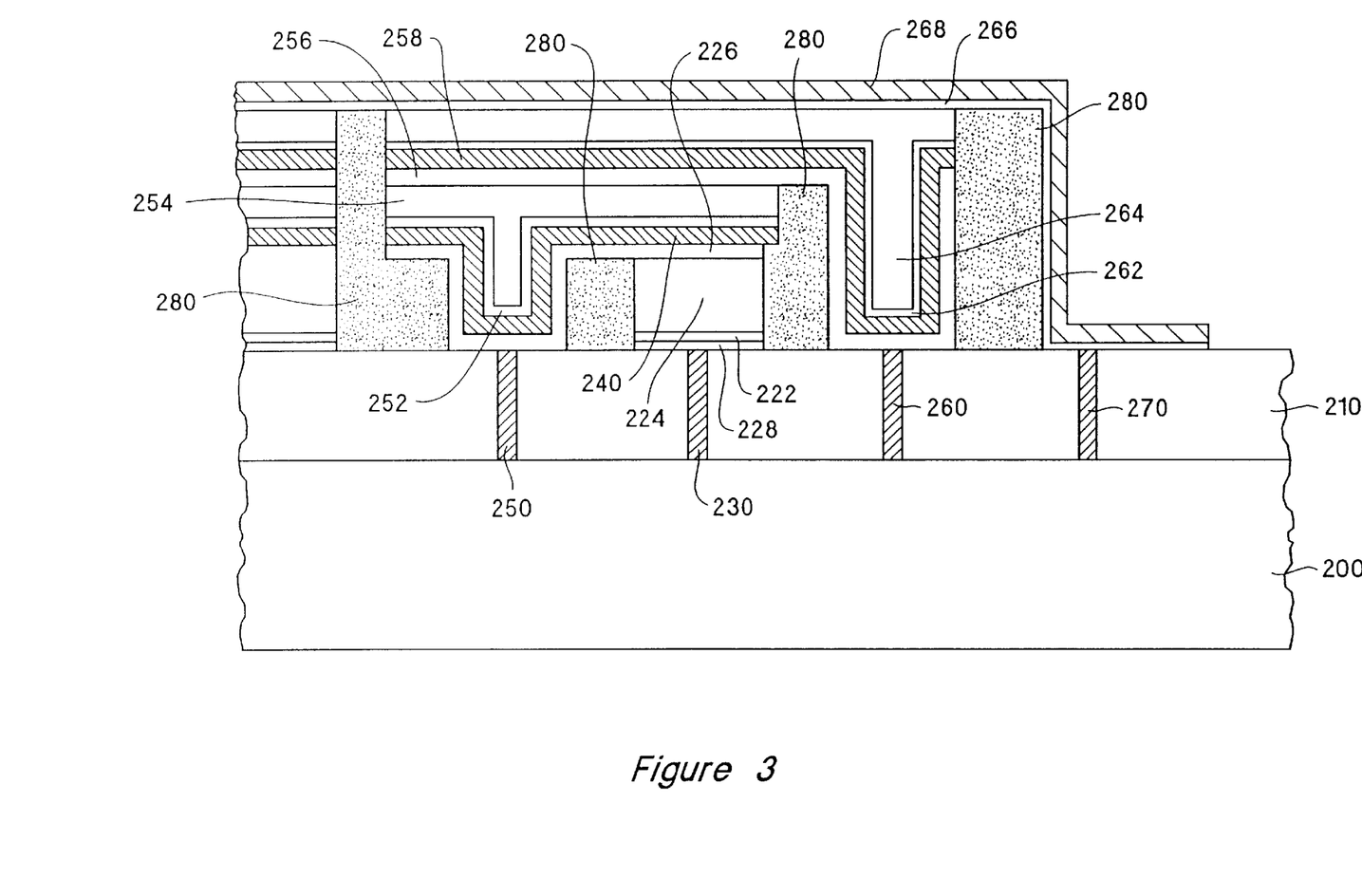
FIG. 3 shows another embodiment of the invention.

FIG. 3 shows another embodiment of the invention. This embodiment is similar to the embodiment of FIG. 2, but includes structural differences due to differences in the processes used to form the embodiments. For the embodiment shown in FIG. 3, the outer layer 226 extends underneath the first transparent conductor 240, the second outer layer 256 extends underneath the second transparent conductor 258 and the third outer layer 266 extends underneath the third transparent conductor 268. The embodiment of FIG. 3 includes the edges of the first outer electrode aligning with edges of the first transparent conductive layer. It is not required that each of the photosensor include this structure.

Figure 4:
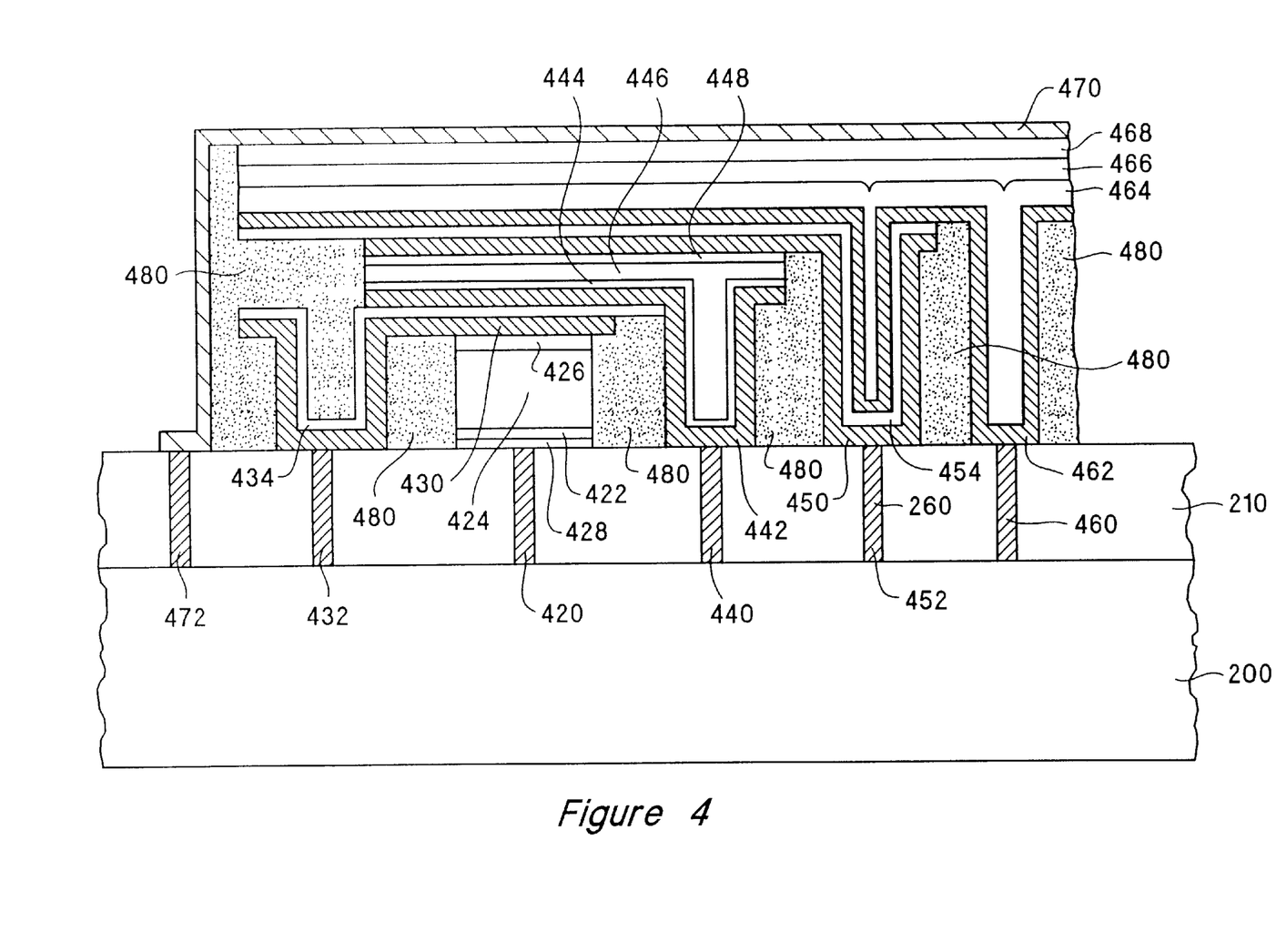
FIG. 4 shows another embodiment of the invention.

FIG. 4 shows another embodiment of the invention. This embodiment is similar to the embodiments of FIG. 2 and FIG. 3. This embodiment includes the first transparent conductive layer being divided into a inner first transparent conductive layer 430 and an outer first transparent conductive layer 442. The second transparent conductive layer is divided into an inner second transparent conductive layer 450 and an outer second transparent conductive layer 462. A first insulating layer 434 is located between the inner first transparent conductive layer 430 and the outer first transparent conductive layer 442. A second insulating layer 454 is located between the inner second transparent conductive layer 450 and the outer second transparent conductive layer 462. Either the first insulating layer 434 or the second insulating layer 454 can be eliminated.

Similar to the embodiments of FIG. 2 and FIG. 3, a first photosensor including a first pixel electrode 422, a first I-layer 424 and an outer layer 426 is formed adjacent to the interconnection layer 210. The interconnection layer 210 includes a first conductive interconnect 420 which electrically connects the first pixel electrode 422 of the first photosensor to the substrate 200. The inner first transparent conductive layer 430 electrically connects a first outer pixel electrode of the first photosensor to the substrate 200 through a second conductive interconnect 432. The first pixel electrode 422 typically includes an inner metal section 428.

This embodiment also includes a second photosensor. The second photosensor includes a second pixel electrode 444, a second I-layer 446 and a second outer layer 448. The second photosensor is formed adjacent to the outer first transparent conductive layer 442. The outer first transparent conductive layer 442 electrically connects the second pixel electrode 444 of the second photosensor to the substrate 200 through a third conductive interconnect 440. The inner second transparent conductive layer 450 electrically connects a second outer pixel electrode of the second photosensor to the substrate 200 through a fourth conductive interconnect 452.

The embodiment can also include a third photosensor. The third photosensor includes a third pixel electrode 464, a third I-layer 466 and a third outer layer 468. The third photosensor is formed adjacent to the outer second transparent conductive layer 462. The outer second transparent conductive layer 462 electrically connects the third pixel electrode 464 of the third photosensor to the substrate 200 through a fifth conductive interconnect 460. A third transparent conductor 470 electrically connects a third outer electrode of the third photosensor to the substrate 200 through a sixth conductive interconnect 472.

Insulating regions 480 are generally included between each of the photosensors. The insulating regions provide isolation between the first photosensor, the second photosensor and the third photosensor. The insulating regions 480, the first insulating layer 434 and the second insulating layer 454, can each be formed from the same or different types of dielectrics.

Dividing the first transparent conductive layer into the inner first transparent conductive layer 430 and the outer first transparent conductive layer 442, and dividing the second transparent conductive layer into the inner second transparent conductive layer 450 and the outer second transparent conductive layer 462, allows the first pixel electrode, the first outer electrode, the second pixel electrode, the second outer electrode, the third pixel electrode and the third outer electrode to be individually biased. The first insulating layer 434 provides insulation between the inner first transparent conductive layer 430 and the outer first transparent conductive layer 442. The second insulating layer 454 provides insulation between the inner second transparent conductive layer 450 and the outer second transparent conductive layer 462.

When reverse biased, each photosensor of the embodiments described in FIG. 2, FIG. 3 and FIG. 4 conducts charge when the photosensor receives light. Each photosensor can be formed to detect varying wavelengths of light depending upon the structure of the photosensor. In particular, the thickness of the I-layer of each photosensor can be adjusted to vary the wavelengths of light detectable by the photosensor. A charge sensor can be connected to the outer electrode of each of the photosensors of the invention to measure the charge conducted by each photosensor, and therefore, determine the intensity of light received by each photosensor. The circuitry required to detect the charge conducted by a photosensor is well known in the art of electronics. The circuitry required to detect the charge conducted by each photosensor can be located on the substrate 200.

The light absorption characteristics of a particular photosensor is dependent upon an absorption length L0 associated with the photosensor. The absorption length L0 is a constant which is generally unique for a particular material. The absorption length L0 of a given material will typically vary depending upon the wavelength of the light being receive by the photosensor.

Figure 5:
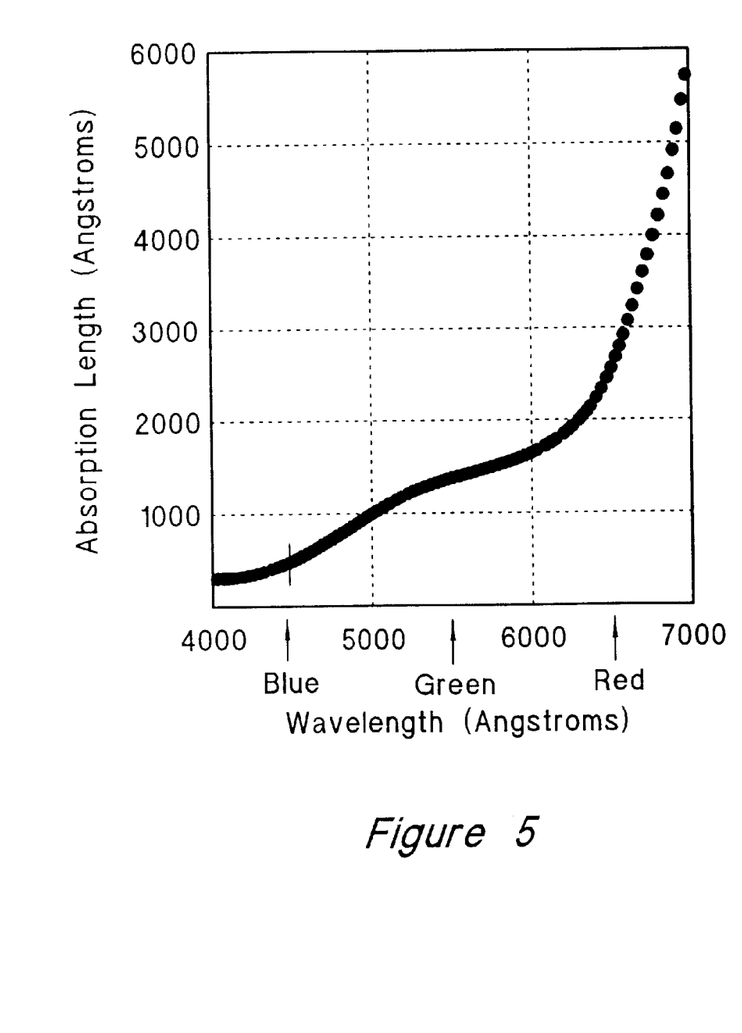
FIG. 5 is a curve which depicts the relationship between the thickness of an I-layer of a PIN photosensor and the wavelength of light absorbed by the I-layer.

FIG. 5 is a plot which depicts the absorption length L0 of amorphous silicon for wavelengths of light varying from 4000 Angstroms to about 7000 Angstroms. Material other than amorphous silicon can be used to form the photosensors of the invention. The absorption length of alternate materials will vary depending upon the characteristics of the materials. For amorphous silicon, the absorption length L0 varies from about 200 Angstroms to about 6000 Angstroms for wavelengths between 4000 Angstroms and 7000 Angstroms.

The amount of light absorbed by the photosensor can be determined by the following relationship:

Absorbed light=$I_0(1-e^{-(x/L0)})$ where $I_0$ is the amount of light of a given wavelength received by the photosensor, and x is the width of the I-layer.

The plot of FIG. 5 shows that the absorption length L0 for amorphous silicon is about 600 Angstroms for blue light having a wavelength of about 4500 Angstroms. The amount of blue light absorbed by a photosensor having an I-layer width of 600 Angstroms is about $I_0(1-e^{-(1)})$ or about 63% of the blue light received by the photosensor. The amount of red light having a wavelength of about 6500 Angstroms which is absorbed by the photosensor having an I-layer thickness of 600 Angstroms is about $I_0(1-e^{-(600/4000)})$, which is a substantially smaller than the amount of blue light absorbed.

An embodiment of the invention includes the thickness of the third I-layer of the third photosensor being between approximately 500 and 800 Angstroms. This embodiment includes the third photosensor detecting blue light having a wavelength of about 4500 Angstroms. The light having wavelengths greater than that of blue light pass through the third photosensor substantially undetected or absorbed.

Another embodiment of the invention includes the thickness of the second I-layer of the second photosensor being between approximately 1200 and 1800 Angstroms. This embodiment includes the second photosensor detecting green light having a wavelength of about 5500Angstroms. The light having wavelengths greater than that of green light pass through the second photosensor substantially undetected or absorbed.

Another embodiment of the invention includes the thickness of the first I-layer of the first photosensor being between approximately 2500 and 3500 Angstroms. This embodiment includes the second photosensor detecting red light having a wavelength of about 6500 Angstroms.

The thickness of the I-layer can be controlled by controlling the amount of I-layer material deposited during the formation of the photosensor.

It should be noted that the light detected by the photosensor does not have to be visible light. For example, any or all of the sensors can be configured to detect near infrared (IR) or ultraviolet (UV) light.

Figure 6:
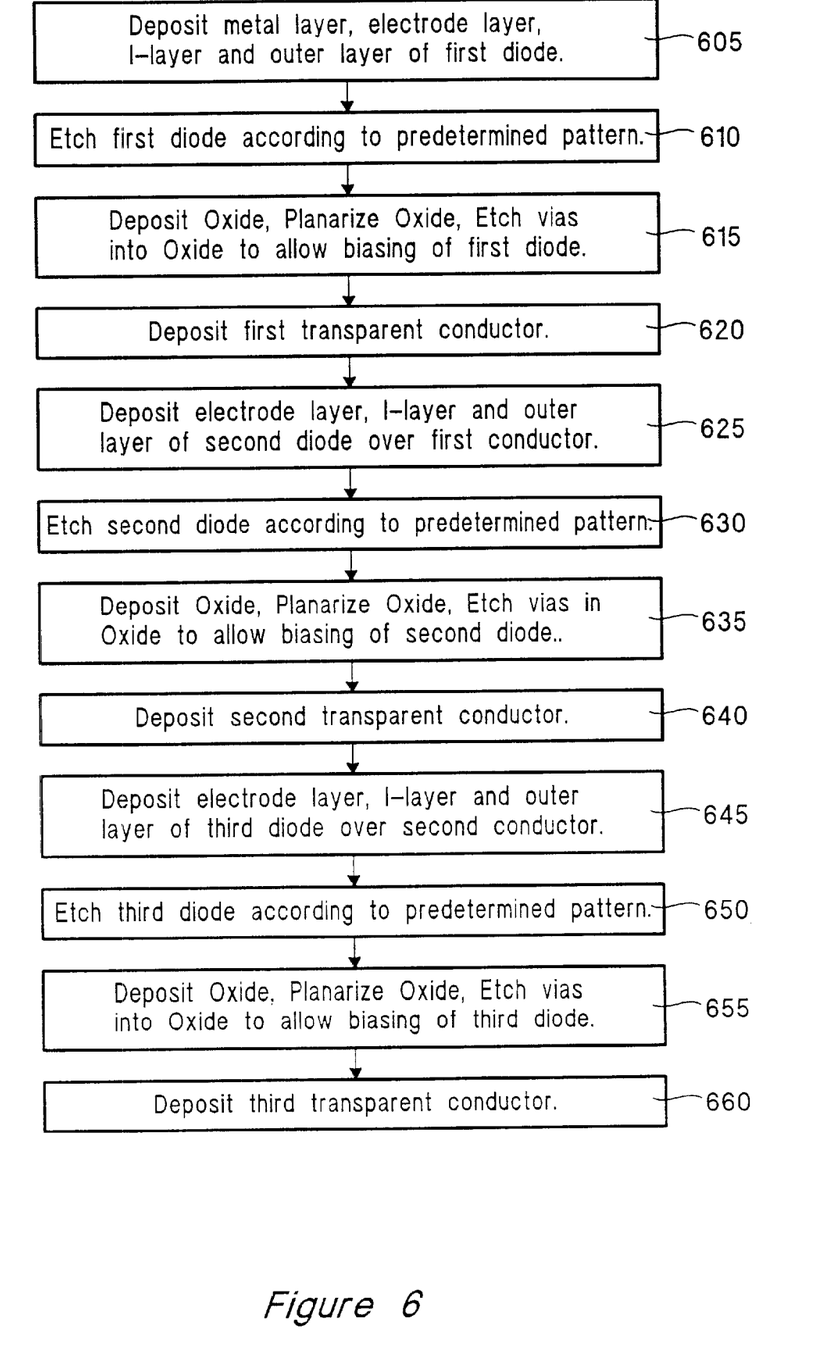
FIG. 6 is a flow chart which shows processing steps which can be used to form the embodiment of the invention shown in FIG. 2.
Figure 7:
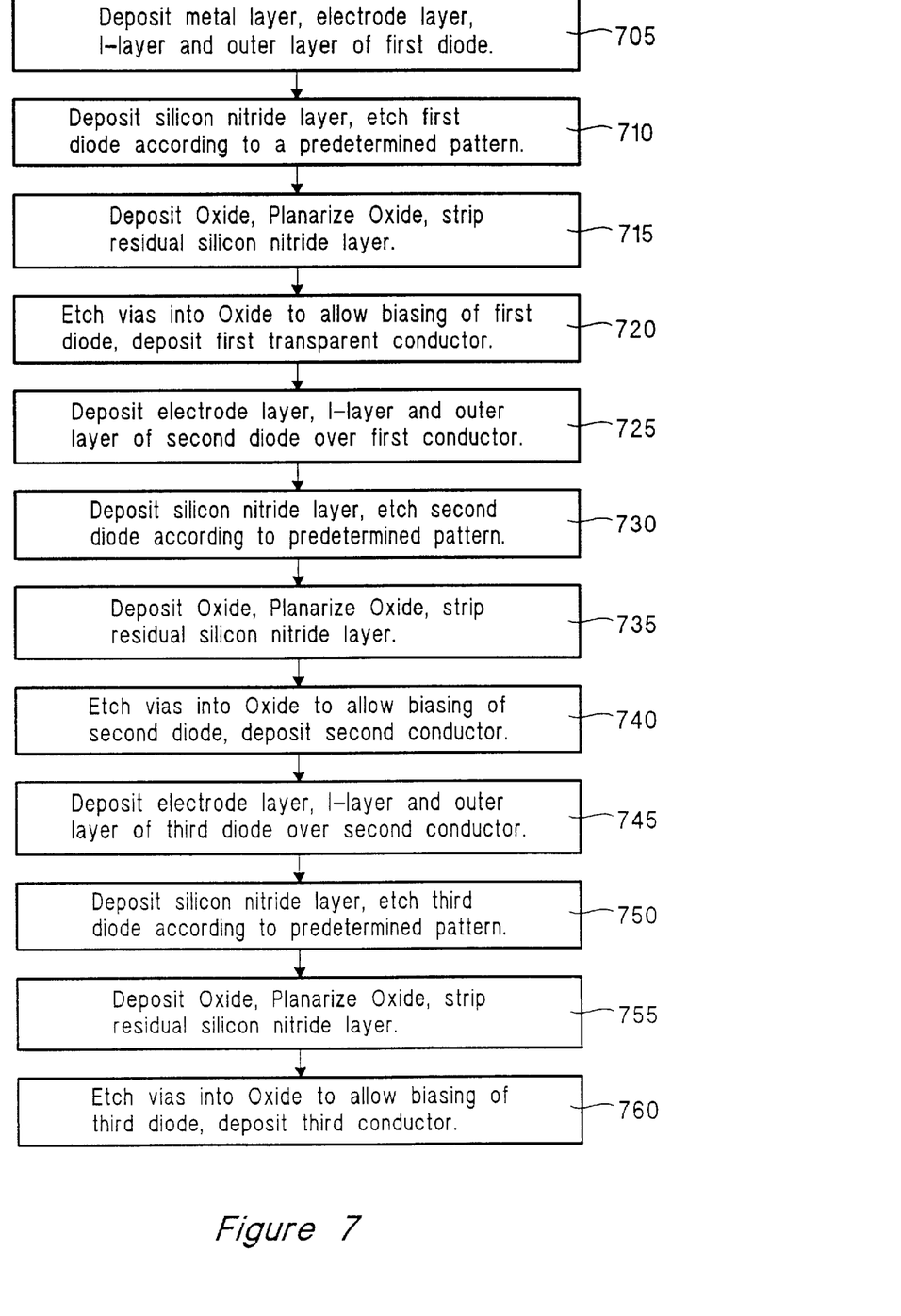
FIG. 7 is a flow chart which shows another set of processing steps which can be used to form the embodiment of the invention shown in FIG. 2.
Figure 8:
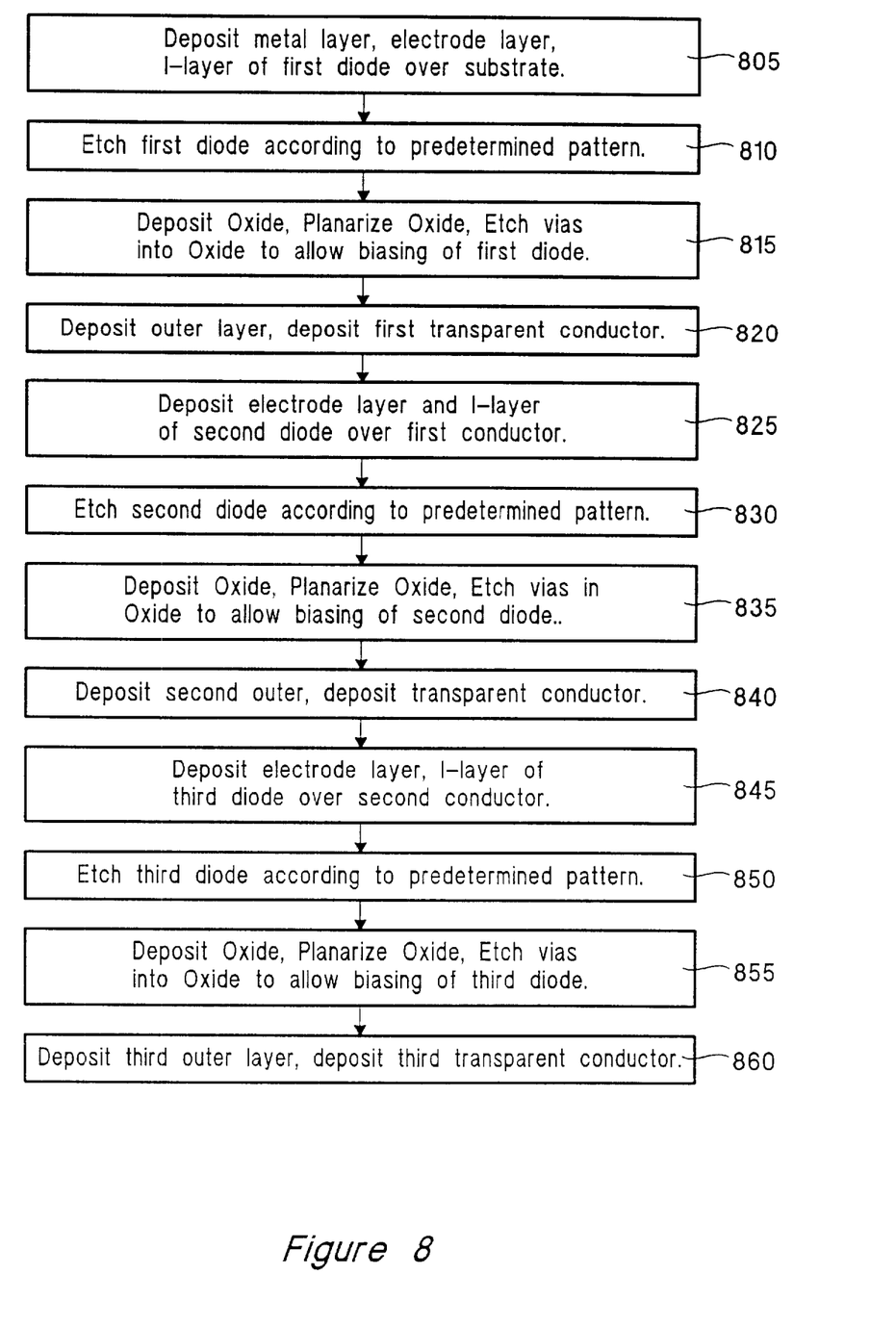
FIG. 8 is a flow chart which shows processing steps which can be used to form the embodiment of the invention shown in FIG. 3.

FIGS. 6–8 are flow charts showing processing steps which can be used to fabricate the embodiments shown in FIG. 2 and FIG. 3.

FIG. 6 is a flow chart which shows processing steps which can be used to form the embodiment of the invention shown in FIG. 2.

A first step 605 includes depositing a metal layer, a first electrode layer, a first I-layer and a first outer layer over an interconnection layer 210 which is formed over a substrate 200. The structure and methods of forming the substrate 200 and the interconnection layer 210 are well known in the field of electronic integrated circuit fabrication.

The interconnection layer 210 is typically formed from a silicon oxide or a silicon nitride. The interconnection layer 210 includes conductive interconnects 230, 250, 260, 270 which are formed using a chemical vapor deposition (CVD) process. Generally, the conductive interconnects 230, 250, 260, 270 are formed from tungsten because tungsten can fill high aspect ratio holes.

The electrode layer can be implemented with an N-layer or a P-layer. Alternatively, the electrode layer can be titanium nitride, tungsten, titanium or other thin film conductors.

The electrode layer is typically deposited using PECVD. The PECVD is performed with a phosphorous containing gas. The phosphorous containing gas can be $PH_3$. The phosphorous containing gas can be $PH_3$. A silicon containing gas, such as $Si_2H_6$ or $SiH_4$, is included when forming amorphous silicon electrode layer.

The I-layer is generally deposited using a PECVD or reactive sputtering process. The PECVD must include a silicon containing gas. The deposition should be at a low enough temperature that hydrogen is retained within the film.

The outer layer can also be deposited using PECVD. The PECVD is performed with a boron containing gas. The boron containing gas can be $B_2H_6$. A silicon containing gas is included when forming an amorphous silicon outer layer.

A second step 610 includes etching the deposited metal layer, the first electrode layer, the first I-layer and the first outer layer to form the first photosensor according to predetermined pattern. Typically, an array of active pixel sensors includes an array of first photosensors. Etching the layers forms the first pixel electrode 222, the first I-layer 224 and the outer layer 226 of the first photosensor.

A third step 615 includes depositing a dielectric such as an oxide, planarizing the oxide and etching a via in the oxide to allow biasing of the first photosensor. The oxide is typically deposited through a PECVD process. The oxide is typically formed from $SiO_2$. The oxide forms the insulating regions 280 between the first photosensor, the second photosensor and the third photosensor. The via is etched where the first transparent conductor 240 electrically connects the first pixel electrode of the first photosensor to the substrate 200.

A fourth step 620 includes depositing the first transparent conductor layer 240. Generally, the first transparent conductor 240 is formed from an indium tin oxide. However, the first transparent conductor 240 can also be formed from titanium nitride, thin silicide, or certain types of conductive transition metal nitrides or oxides.

The first transparent conductor layer 240 is generally deposited through reactive sputtering. However, the first transparent conductor layer 240 can also be grown by evaporation. If the first transparent conductor layer 240 is formed from titanium nitride, then typically a CVD process or a sputtering process must be used to deposit the first transparent conductor layer 240.

A fifth step 625 includes depositing a second electrode layer, a second I-layer and a second outer layer over the first transparent conductor layer 240.

The second electrode layer can be implemented with an N-layer or a P-layer. Alternatively, the second electrode layer can be a conductive nitride, like, titanium nitride.

The second electrode layer is typically deposited using PECVD. The PECVD is performed with a phosphorous containing gas. The phosphorous containing gas can be $PH_3$. The phosphorous containing gas can be $PH_3$. A silicon containing gas, such as $Si_2H_6$ or $SiH_4$, is included when forming an amorphous silicon electrodes layer.

The second I-layer is generally deposited using a PECVD or reactive sputtering process. The PECVD must include a silicon containing gas. The deposition should be at a low enough temperature that hydrogen is retained within the film.

The second outer layer can also be deposited using PECVD. The PECVD is performed with a boron containing gas. The boron containing gas can be $B_2H_6$. A silicon containing gas is included when forming an amorphous silicon outer layer.

A sixth step 630 includes etching the deposited second electrode layer, the second I-layer and the second outer layer to form the second photosensor according to predetermined pattern. Typically, an array of active pixel sensors includes an array of second photosensors. Etching the layers forms the second pixel electrode 252, the second I-layer 254 and the second outer layer 256 of the second photosensor.

A seventh step 635 includes depositing a dielectric such as an oxide, planarizing the oxide and etching a via in the oxide to allow biasing of the second photosensor. The oxide is typically deposited through a PECVD process. The oxide is typically formed from $SiO_2$. The oxide forms the insulating regions 280 between the first photosensor, the second photosensor and the third photosensor. The via is etched where the second transparent conductor 258 electrically connects the second pixel electrode 252 of the second photosensor to the substrate 200.

An eighth step 640 includes depositing the second transparent conductor layer 258. Generally, the second transparent conductor layer 258 is formed from an indium tin oxide. However, the second transparent conductor layer 258 can also be formed from titanium nitride, thin silicide, or certain types of transition metal nitrides or oxides.

The second transparent conductor layer 258 is generally deposited through reactive sputtering. However, the second transparent conductor layer 258 can also be grown by evaporation. If the second transparent conductor layer 258 is formed from titanium nitride, then typically a CVD process or a sputtering process must be used to deposit the second transparent conductor layer 258.

A ninth step 645 includes depositing a third electrode layer, a third I-layer and a third outer layer over the second transparent conductor layer 258.

The third electrode layer can be implemented with an N-layer or a P-layer. Alternatively, the third electrode layer can be a conductive nitride, like, titanium nitride.

The third electrode layer is typically deposited using PECVD. The PECVD is performed with a phosphorous containing gas. The phosphorous containing gas can be $PH_3$. The phosphorous containing gas can be $PH_3$. A silicon containing gas, such as $Si_2H_6$ or $SiH_4$, is included when forming an amorphous silicon electrode layer.

The third I-layer is generally deposited using a PECVD or reactive sputtering process. The PECVD must include a silicon containing gas. The deposition should be at a low enough temperature that hydrogen is retained within the film.

The third outer layer can also be deposited using PECVD. The PECVD is performed with a boron containing gas. The boron containing gas can be $B_2H_6$. A silicon containing gas is included when forming an amorphous silicon outer layer.

A tenth step 650 includes etching the deposited third electrode layer, the third I-layer and the third outer layer to form the third photosensor according to predetermined pattern. Typically, an array of active pixel sensors includes an array of third photosensors. Etching the layers forms the third pixel electrode 262, the third I-layer 264 and the third outer layer 266 of the third photosensor.

An eleventh step 655 includes depositing an oxide, planarizing the oxide and etching a via in the oxide to allow biasing of the third photosensor. The oxide is typically deposited through a PECVD process. The oxide is typically formed from $SiO_2$. The oxide forms the insulating regions 280 between the first photosensor, the third photosensor and the third photosensor. The via is etched where the third transparent conductor 268 electrically connects the third pixel electrode 262 of the third photosensor to the substrate 200.

A twelfth step 660 includes depositing the third transparent conductor layer 268. Generally, the third transparent conductor layer 268 is formed from an indium tin oxide. However, the third transparent conductor layer 268 can also be formed from titanium nitride, thin silicide, or certain types of transition metal nitrides or oxides.

The third transparent conductor layer 268 is generally deposited through reactive sputtering. However, the third transparent conductor layer 268 can also be grown by evaporation. If the third transparent conductor layer 268 is formed from titanium nitride, then typically a CVD process or a sputtering process must be used to deposit the third transparent conductor layer 268.

FIG. 7 is a flow chart which shows another set of processing steps which can be used to form the embodiment of the invention shown in FIG. 2. This method allows for planarization of the insulating oxide regions.

A first step 705 includes depositing a metal layer, a first electrode layer, a first I-layer and a first outer layer over an interconnection layer 210 which is formed over a substrate 200. The structure and methods of forming the substrate 200 and the interconnection layer 210 are well known in the field of electronic integrated circuit fabrication.

The interconnection layer 210 is typically formed from a silicon oxide or a silicon nitride. The interconnection layer 210 includes conductive interconnects 230, 250, 260, 270 which are formed using a chemical vapor deposition (CVD) process. Generally, the conductive interconnects 230, 250, 260, 270 are formed from tungsten because tungsten can fill high aspect ratio holes.

The electrode layer can be implemented with an N-layer or a P-layer. Alternatively, the electrode layer can be a conductive nitride, like, titanium nitride.

The electrode layer is typically deposited using PECVD. The PECVD is performed with a phosphorous containing gas. The phosphorous containing gas can be $PH_3$. The phosphorous containing gas can be $PH_3$. A silicon containing gas, such as $Si_2H_6$ or $SiH_4$, is included when forming amorphous silicon electrode layer.

The I-layer is generally deposited using a PECVD or reactive sputtering process. The PECVD must include a silicon containing gas. The deposition should be at a low enough temperature that hydrogen is retained within the film.

The outer layer can also be deposited using PECVD. The PECVD is performed with a boron containing gas. The boron containing gas can be $B_2H_6$. A silicon containing gas is included when forming an amorphous silicon outer layer.

A second step 710 includes depositing a silicon nitride stop layer and etching the deposited metal layer, the first electrode layer, the first I-layer and the first outer layer to form the first photosensor according to a predetermined pattern. The silicon nitride stop layer is deposited because the silicon nitride stop layer provides for better control of planarization, and protects electrically active layer underneath the silicon nitride stop layer. Typically, an array of active pixel sensors includes an array of first photosensors. Etching the layers forms the first pixel electrode 222, the first I-layer 224 and the outer layer 226 of the first photosensor.

A third step 715 includes depositing on oxide, planarizing the oxide and stripping any residual silicon nitride stop layer. The oxide is typically deposited through a PECVD process. The oxide is typically formed from $SiO_2$. The oxide forms the insulating regions 280 between the first photosensor, the second photosensor and the third photosensor. After planarizing the oxide, residual silicon nitride stop layer may still reside over the formed pixels. The residual silicon nitride stop layer is typically stripped by an $H_3PO_4$ wet solution.

A fourth step 720 includes etching a via in the oxide to allow biasing of the first photosensor, and depositing the first transparent conductor layer 240. The via is etched where the first transparent conductor 240 electrically connects the first pixel electrode 222 of the first photosensor to the substrate 200. Generally, the first transparent conductor 240 is formed from an indium tin oxide. However, the first transparent conductor 240 can also be formed from titanium nitride, thin silicide, or certain types of transition metal nitrides or oxides.

The first transparent conductor layer 240 is generally deposited through reactive sputtering. However, the first transparent conductor layer 240 can also be grown by evaporation. If the first transparent conductor layer 240 is formed from titanium nitride, then typically a CVD process or a sputtering process must be used to deposit the first transparent conductor layer 240.

A fifth step 725 includes depositing a second electrode layer, a second I-layer and a second outer layer over the first transparent conductor layer 240.

The second electrode layer can be implemented with an N-layer or a P-layer. Alternatively, the second electrode layer can be a conductive nitride, like, titanium nitride.

The second electrode layer is typically deposited using PECVD. The PECVD is performed with a phosphorous containing gas. The phosphorous containing gas can be $PH_3$. The phosphorous containing gas can be $PH_3$. A silicon containing gas, such as $Si_2H_6$ or $SiH_4$, is included when forming an amorphous silicon electrodes layer.

The second I-layer is generally deposited using a PECVD or reactive sputtering process. The PECVD must include a silicon containing gas. The deposition should be at a low enough temperature that hydrogen is retained within the film.

The second outer layer can also be deposited using PECVD. The PECVD is performed with a boron containing gas. The boron containing gas can be $B_2H_6$. A silicon containing gas is included when forming an amorphous silicon outer layer.

A sixth step 730 includes depositing an silicon nitride stop layer and etching the deposited second electrode layer, the second I-layer and the second outer layer to form the second photosensor according to predetermined pattern. The silicon nitride stop layer is deposited because the silicon nitride stop layer provides for better control of planarization, and protects electrically active layers beneath the silicon nitride stop layer. Typically, an array of active pixel sensors includes an array of second photosensors. Etching the layers forms the second pixel electrode 252, the second I-layer 254 and the second outer layer 256 of the second photo sensor.

A seventh step 735 includes depositing a dielectric such as an oxide, planarizing the oxide and stripping any residual silicon nitride stop layer. The oxide is typically deposited through a PECVD process. The oxide is typically formed from $SiO_2$. The oxide forms the insulating regions 280 between the first photosensor, the second photosensor and the third photosensor. After planarizing the oxide, residual silicon nitride stop layer may still reside over the formed pixels. The residual silicon nitride stop layer is typically stripped by an $H_3PO_4$ wet solution.

An eighth step 740 includes etching a via in the oxide to allow biasing of the second photosensor, and depositing the second transparent conductor layer 258. The via is etched where the second transparent conductor 258 electrically connects the second pixel electrode 252 of the second photosensor to the substrate 200. Generally, the second transparent conductor layer 258 is formed from an indium tin oxide. However, the second transparent conductor layer 258 can also be formed from titanium nitride, thin silicide, or certain types of transition metal nitrides or oxides.

The second transparent conductor layer 258 is generally deposited through reactive sputtering. However, the second transparent conductor layer 258 can also be grown by evaporation. If the second transparent conductor layer 258 is formed from titanium nitride, then typically a CVD process or a sputtering process must be used to deposit the second transparent conductor layer 258.

A ninth step 745 includes depositing a third electrode layer, a third I-layer and a third outer layer over the second transparent conductor layer 258.

The third electrode layer can be implemented with an N-layer or a P-layer. Alternatively, the third electrode layer can be a conductive nitride, like, titanium nitride.

The third electrode layer is typically deposited using PECVD. The PECVD is performed with a phosphorous containing gas. The phosphorous containing gas can be $PH_3$. The phosphorous containing gas can be $PH_3$. A silicon containing gas, such as $Si_2H_6$ or $SiH_4$, is included when forming an amorphous silicon electrode layer.

The third I-layer is generally deposited using a PECVD or reactive sputtering process. The PECVD must include a silicon containing gas. The deposition should be at a low enough temperature that hydrogen is retained within the film.

The third outer layer can also be deposited using PECVD. The PECVD is performed with a boron containing gas. The boron containing gas can be $B_2H_6$. A silicon containing gas is included when forming an amorphous silicon outer layer.

A tenth step 750 includes depositing an silicon nitride stop layer and etching the deposited third electrode layer, the third I-layer and the third outer layer to form the third photosensor according to predetermined pattern. The silicon nitride stop layer is deposited because the silicon nitride stop layer provides for better control of planarization, and protects electrically active layers beneath the silicon nitride stop layer. Typically, an array of active pixel sensors includes an array of third photosensors. Etching the layers forms the third pixel electrode 262, the third I-layer 264 and the third outer layer 266 of the third photosensor.

An eleventh step 755 includes depositing a dielectric such as an oxide, planarizing the oxide and stripping any residual silicon nitride stop layer. The oxide is typically deposited through a PECVD process. The oxide is typically formed from $SiO_2$. The oxide forms the insulating regions 280 between the first photosensor, the third photosensor and the third photosensor. After planarizing the oxide, residual silicon nitride stop layer may still reside over the formed pixels. The residual silicon nitride stop layer is typically stripped by an $H_3PO_4$ wet solution.

A twelfth step 760 includes etching a via in the oxide to allow biasing of the third photosensor, and depositing the third transparent conductor layer 268. The via is etched where the third transparent conductor 268 electrically connects the third pixel electrode 262 of the third photosensor to the substrate 200. Generally, the third transparent conductor layer 268 is formed from an indium tin oxide. However, the third transparent conductor layer 268 can also be formed from titanium nitride, thin suicide, or certain types of transition metal nitrides or oxides.

The third transparent conductor layer 268 is generally deposited through reactive sputtering. However, the third transparent conductor layer 268 can also be grown by evaporation. If the third transparent conductor layer 268 is formed from titanium nitride, then typically a CVD process or a sputtering process must be used to deposit the third transparent conductor layer 268.

The silicon nitride stop layer of the third step 715, the sixth step 730, and the tenth step 750, can be replaced by any material which provides the required etching selectivity of the isolation dielectric, and can be stripped by a method that is selective relative to the dielectric and the photosensor films.

FIG. 8 is a flow chart which shows processing steps which can be used to form the embodiment of the invention shown in FIG. 3.

A first step 805 includes depositing a metal layer, a first electrode layer and a first I-layer over an interconnection layer 210 which is formed over a substrate 200. The stricture and methods of forming the substrate 200 and the interconnection layer 210 are well known in the field of electronic integrated circuit fabrication.

The interconnection layer 210 is typically formed from a silicon oxide or a silicon nitride. The interconnection layer 210 includes conductive interconnects 230, 250, 260, 270 which are formed using a chemical vapor deposition (CVD) process. Generally, the conductive interconnects 230, 250, 260, 270 are formed from tungsten because tungsten can fill high aspect ratio holes.

The electrode layer can be implemented with an N-layer or a P-layer. Alternatively, the electrode layer can be titanium nitride, tungsten, titanium or other thin film conductors.

The electrode layer is typically deposited using PECVD. The PECVD is performed with a phosphorous containing gas. The phosphorous containing gas can be $PH_3$. The phosphorous containing gas can be $PH_3$. A silicon containing gas, such as $Si_2H_6$ or $SiH_4$, is included when forming amorphous silicon electrode layer.

The I-layer is generally deposited using a PECVD or reactive sputtering process. The PECVD must include a silicon containing gas. The deposition should be at a low enough temperature that hydrogen is retained within the film.

A second step 810 includes etching the deposited metal layer, the first electrode layer and the first I-layer to form the first photosensor according to predetermined pattern. Typically, an array of active pixel sensors includes an array of first photosensors. Etching the layers forms the first pixel electrode 222 and the first I-layer 224 of the first photosensor.

A third step 815 includes depositing on oxide, planarizing the oxide and etching a via in the oxide to allow biasing of the first photosensor. The oxide is typically deposited through a PECVD process. The oxide is typically formed from $SiO_2$. The oxide forms the insulating regions 280 between the first photosensor, the second photosensor and the third photosensor. The via is etched where the first transparent conductor 240 electrically connects the first pixel electrode 222 of the first photosensor to the substrate 200.

A fourth step 820 includes depositing a first outer layer and the first transparent conductor layer 240. The outer layer can be deposited using PECVD. The PECVD is performed with a boron containing gas. The boron containing gas can be $B_2H_6$. A silicon containing gas is included when forming an amorphous silicon outer layer. Generally, the first transparent conductor 240 is formed from an indium tin oxide. However, the first transparent conductor 240 can also be formed from titanium nitride, thin suicide, or certain types of transition metal nitrides or oxides.

The first transparent conductor layer 240 is generally deposited through reactive sputtering. However, the first transparent conductor layer 240 can also be grown by evaporation. If the first transparent conductor layer 240 is formed from titanium nitride, then typically a CVD process or a sputtering process must be used to deposit the first transparent conductor layer 240.

A fifth step 825 includes depositing a second electrode layer and a second I-layer over the first transparent conductor layer 240.

The second electrode layer can be implemented with an N-layer or a P-layer. Alternatively, the second electrode layer can be a conductive nitride, like, titanium nitride.

The second electrode layer is typically deposited using PECVD. The PECVD is performed with a phosphorous containing gas. The phosphorous containing gas can be $PH_3$. The phosphorous containing gas can be $PH_3$. A silicon containing gas, such as $Si_2H_6$ or $SiH_4$, is included when forming an amorphous silicon electrodes layer.

The second I-layer is generally deposited using a PECVD or reactive sputtering process. The PECVD must include a silicon containing gas. The deposition should be at a low enough temperature that hydrogen is retained within the film.

A sixth step 830 includes etching the deposited second electrode layer and the second I-layer to form the second photosensor according to predetermined pattern. Typically, an array of active pixel sensors includes an array of second photosensors. Etching the layers forms the second pixel electrode 252, the second I-layer 254 and the second outer layer 256 of the second photosensor.

A seventh step 835 includes depositing on oxide, planarizing the oxide and etching a via in the oxide to allow biasing of the second photosensor. The oxide is typically deposited through a PECVD process. The oxide is typically formed from $SiO_2$. The oxide forms the insulating regions 280 between the first photosensor, the second photosensor and the third photosensor. The via is etched where the second transparent conductor 258 electrically connects the second pixel electrode 252 of the second photosensor to the substrate 200.

An eighth step 840 includes depositing a second outer layer and the second transparent conductor layer 258. The second outer layer can be deposited using PECVD. The PECVD is performed with a boron containing gas. The boron containing gas can be $B_2H_6$. A silicon containing gas is included when forming an amorphous silicon outer layer. Generally, the second transparent conductor layer 258 is formed from an indium tin oxide. However, the second transparent conductor layer 258 can also be formed from titanium nitride, thin suicide, or certain types of transition metal nitrides or oxides.

The second transparent conductor layer 258 is generally deposited through reactive sputtering. However, the second transparent conductor layer 258 can also be grown by evaporation. If the second transparent conductor layer 258 is formed from titanium nitride, then typically a CVD process or a sputtering process must be used to deposit the second transparent conductor layer 258.

A ninth step 845 includes depositing a third electrode layer and a third I-layer over the second transparent conductor layer 258.

The third electrode layer can be implemented with an N-layer or a P-layer. Alternatively, the third electrode layer can be a conductive nitride, like, titanium nitride.

The third electrode layer is typically deposited using PECVD. The PECVD is performed with a phosphorous containing gas. The phosphorous containing gas can be $PH_3$. The phosphorous containing gas can be $PH_3$. A silicon containing gas, such as $Si_2H_6$ or $SiH_4$, is included when forming an amorphous silicon electrode layer.

The third I-layer is generally deposited using a PECVD or reactive sputtering process. The PECVD must include a silicon containing gas. The deposition should be at a low enough temperature that hydrogen is retained within the film.

The third outer layer can also be deposited using PECVD. The PECVD is performed with a boron containing gas. The boron containing gas can be $B_2H_6$. A silicon containing gas is included when forming an amorphous silicon outer layer.

A tenth step 850 includes etching the deposited third electrode layer and the third I-layer to form the third photosensor according to predetermined pattern. Typically, an array of active pixel sensors includes an array of third photosensors. Etching the layers forms the third pixel electrode 262 and the third I-layer 264 of the third photosensor.

An eleventh step 855 includes depositing an oxide, planarizing the oxide and etching a via in the oxide to allow biasing of the third photosensor. The oxide is typically deposited through a PECVD process. The oxide is typically formed from $SiO_2$. The oxide forms the insulating regions 280 between the first photosensor, the third photosensor and the third photosensor. The via is etched where the third transparent conductor 268 electrically connects the third pixel electrode 262 of the third photosensor to the substrate 200.

A twelfth step 860 includes depositing a third outer layer and the third transparent conductor layer 268. The third outer layer can be deposited using PECVD. The PECVD is performed with a boron containing gas. The boron containing gas can be $B_2H_6$. A silicon containing gas is included when forming an amorphous silicon outer layer. Generally, the third transparent conductor layer 268 is formed from an indium tin oxide. However, the third transparent conductor layer 268 can also be formed from titanium nitride, thin suicide, or certain types of transition metal nitrides or oxides.

The third transparent conductor layer 268 is generally deposited through reactive sputtering. However, the third transparent conductor layer 268 can also be grown by evaporation. If the third transparent conductor layer 268 is formed from titanium nitride, then typically a CVD process or a sputtering process must be used to deposit the third transparent conductor layer 268.

The embodiment of FIG. 4 can generally be formed by the processing steps of the flow charts of FIGS. 6–9. However, the deposition of each conductive layer includes the deposition of a conductive layer, an insulating layer and another conductive layer.

Although specific embodiments of the invention have been described and illustrated, the invention is not to be limited to the specific forms or arrangements of parts so described and illustrated. The invention is limited only by the claims.

What is claimed:

1. A image sensor array comprising:

a substrate;

a first photosensor, having a surface in contact with the substrate, having a first pixel electrode electrically connected to the substrate and a first outer electrode;

a first transparent conductive layer, having a surface connected to the first photosensor, electrically connecting the first outer electrode to the substrate;

a second photosensor, having a surface connected to the first transparent conductive layer, having a second pixel electrode electrically connected to the substrate through the first transparent conductive layer and a second outer electrode; and a second transparent conductive layer, having a surface connected to the second photosensor, electrically connecting the second outer electrode to the substrate.

2. The image sensor array of claim 1, further comprising:

third photosensor, having a surface connected to the second transparent conductive layer, having a third pixel electrode electrically connected to the substrate through the second transparent conductive layer and a third outer electrode; and a third conductive layer, having a surface connected to the third photosensor, electrically connecting the third outer electrode to the substrate.

3. The image sensor array as recited in claim 2, the second transparent conductive layer comprising:

an inner second transparent conductive layer;

an outer second transparent conductive layer; and a second insulating layer interposing the inner second transparent conductive layer and the outer second transparent conductive layer;

wherein the inner second transparent conductive layer electrically connects the second outer electrode to the substrate and the outer second transparent conductive layer electrically connects the third pixel electrode to the substrate.

4. The image sensor array as recited in claim 2, wherein the third transparent conductive layer comprises an inner surface electrically connected to the third outer electrode of the third photosensor and the substrate.

5. The image sensor array as recited in claim 2, wherein the third photosensor includes a third electrode layer and a third I-layer.

6. The image sensor array as recited in claim 4, wherein a conductive plug electrically connects the inner surface of the third transparent conductive layer to the substrate.

7. The image sensor array as recited in claim 5, wherein the third I-layer has a thickness of about 3000 Angstroms, and the third photosensor detects red light.

8. The image sensor array as recited in claim 5, wherein the third photosensor further includes a third P-layer formed over the third I-layer.

9. The image sensor array of claim 1, wherein the first photosensor detects a first range of wavelengths of light.

10. The image sensor array of claim 1, wherein the second photosensor detects a second range of wavelengths of light.

11. The image sensor array of claim 1, wherein the third photosensor detects a third range of wavelengths of light.

12. The image sensor array as recited in claim 1, the first transparent conductive layer comprising:

an inner first transparent conductive layer;

an outer first transparent conductive layer; and a first insulating layer interposing the inner first transparent conductive layer and the outer first transparent conductive layer;

wherein the inner first transparent conductive layer electrically connects the first outer electrode to the substrate and the outer first transparent conductive layer electrically connects the second pixel electrode to the substrate.

13. The image sensor array as recited in claim 1, the first transparent conductive layer comprises an inner surface electrically connected to the first outer electrode and the substrate.

14. The image sensor array as recited in claim 13, wherein a conductive plug electrically connects the inner surface of the first transparent conductive layer to the substrate.

15. The image sensor array as recited in claim 13, wherein edges of the first outer electrode align with edges of the first transparent conductive layer.

16. The image sensor array as recited in claim 1, wherein the second transparent conductive layer comprises an inner surface electrically connected to the second outer electrode of the second photosensor and the substrate.

17. The image sensor array as recited in claim 16, wherein a conductive plug electrically connects the inner surface of the second transparent conductive layer to the substrate.

18. The image sensor array as recited in claim 1, wherein the first photosensor includes an electrode layer and an I-layer.

19. The image sensor array as recited in claim 18, wherein the I-layer has a thickness of about 600 Angstroms, and the first photosensor detects blue light.

20. The image sensor array as recited in claim 18, wherein the first photosensor further includes a P-layer formed over the I-layer.

21. The image sensor array as recited in claim 1, wherein the second photosensor includes a second electrode layer and a second I-layer.

22. The image sensor array as recited in claim 21, wherein the second I-layer has a thickness of about 1500 Angstroms, and the second photosensor detects green light.

23. The image sensor array as recited in claim 21, wherein the second photosensor further includes a second P-layer formed over the second I-layer.

* * * * *